United States Patent [19]

Staiger

[11] Patent Number: 5,524,123
[45] Date of Patent: Jun. 4, 1996

[54] METHOD FOR THE COMPUTER-CONTROLLED GENERATION OF PULSE INTERVAL SEQUENCES WITH PERIODS OF REPEATING PULSE INTERVALS

[75] Inventor: Dieter E. Staiger, Schoenbuch, Germany

[73] Assignee: International Business Machine Corporation, Armonk, N.Y.

[21] Appl. No.: 380,924

[22] Filed: Jan. 31, 1995

Related U.S. Application Data

[63] Continuation of Ser. No. 95,618, Jul. 21, 1993, abandoned.

[30] Foreign Application Priority Data

Jul. 23, 1992 [EP] European Pat. Off. .............. 92112629

[51] Int. Cl.[6] ................................ H03K 5/04; H03K 7/08
[52] U.S. Cl. ........................ 375/238; 375/239; 327/291; 327/172
[58] Field of Search ..................... 375/237, 239, 375/238; 307/106; 328/59, 61, 63, 58; 377/47; 364/717.5; 340/825.64; 371/27; 327/164, 172, 175, 291, 299

[56] References Cited

U.S. PATENT DOCUMENTS

| | | | |
|---|---|---|---|
| 3,639,695 | 2/1972 | Bertheas | 375/23 |
| 4,109,210 | 8/1978 | Gerlach et al. | 328/58 |
| 4,257,108 | 3/1981 | Igel | 328/59 |
| 4,388,719 | 6/1983 | Soltysik et al. | 371/27 |
| 4,415,861 | 11/1983 | Palmquist et al. | 328/58 |
| 4,864,160 | 9/1989 | Abdoo | 371/27 |

Primary Examiner—Stephen Chin
Assistant Examiner—Timothy J. May
Attorney, Agent, or Firm—Thornton & Thornton; J. Denis Moore

[57] ABSTRACT

A method and apparatus for the computer-controlled generation of pulses which are arranged in intervals which intervals are grouped in a sequence that is to be repeated. The apparatus employs a preprocessor which supplies, to a revolver processor, data indicating the number and duration of immediately successive identical pulses in each of the intervals forming a sequence as well as data indicating the number of repetitions of the sequence. The first and the last pulse interval within the sequence to be repeated is marked. This data is cycled under clock control in the revolver processor which includes a data input station and a data output station. The clock-controlled cycled data reaching the output station is supplied, by a postprocessor, to a pulse cycle generator for generating the pulses. In response to a tag in the output station marking the start of a sequence to be repeated, the clock-controlled cycle is interrupted, with the data stages being subsequently cyclically addressed under processor control from the first to the last pulse interval in the sequence according to the number of repetitions. The data of each addressed stage is supplied from the output station to the pulse cycle generator. The postprocessor generates from the information of the revolver processor the values for successive pulses forming each interval for controlling the pulse cycle generator.

4 Claims, 11 Drawing Sheets

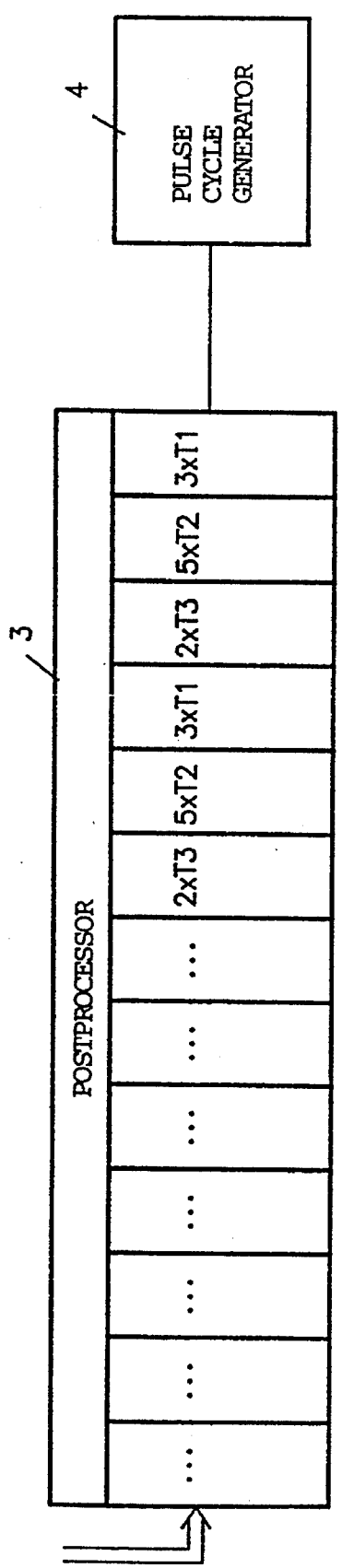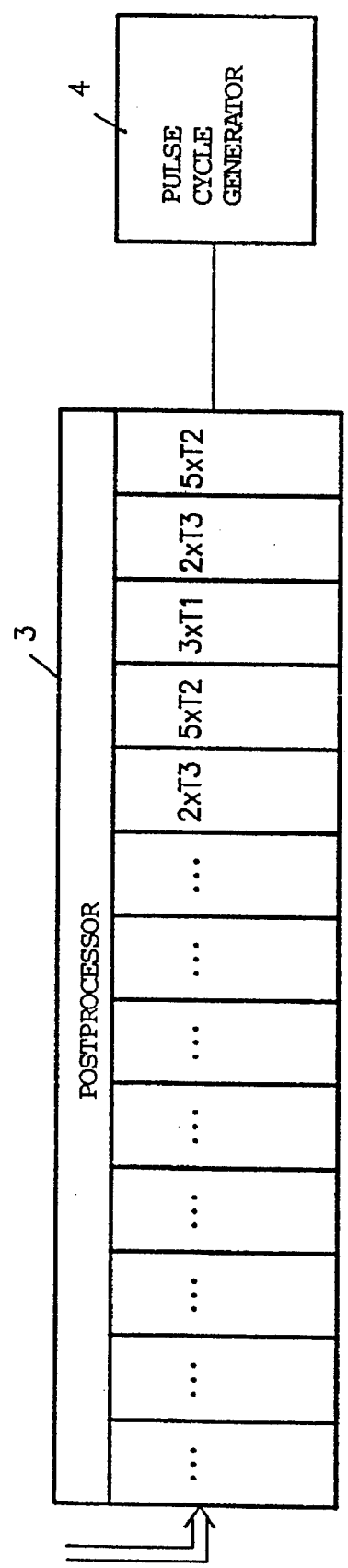
FIG. 5A
FIG. 5B

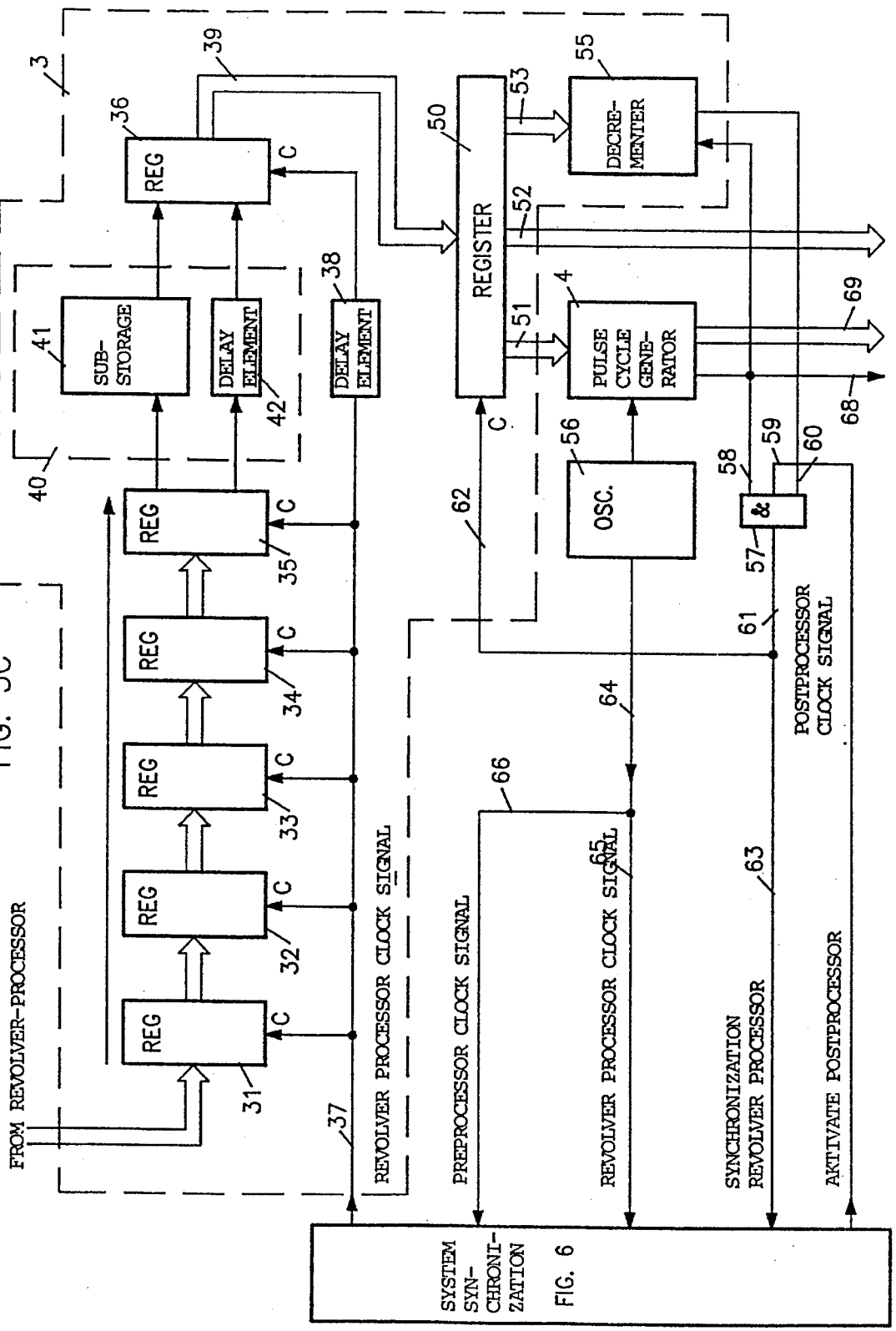

METHOD FOR THE COMPUTER-CONTROLLED GENERATION OF PULSE INTERVAL SEQUENCES WITH PERIODS OF REPEATING PULSE INTERVALS

The application is a continuation of application Ser. No. 08/095,618, filed Jul. 21, 1993, abandoned.

BACKGROUND OF THE INVENTION

1. Field of the Invention

The invention relates to a method for the computer-controlled generation of pulse intervals with periods of repeating pulse intervals.

2. Background Art

A method of this type is disclosed, for example, in German Patent No. 27 46 743 commonly owned by the applicant.

The essential feature of the method described in the aforementioned patent is that no dead times occur between the pulse intervals to be generated. The length of the pulse intervals is determined by a decrementer. Before the decrement procedure is run (i.e. before status "0" is reached) the decrementer is loaded with a new value (for the next pulse cycle), so that the new decrement procedure follows on from the previous one immediately.

A processor is generally used in implementing this procedure. Most processors operate on the "von Neumann principle": a controller is supplied with instructions contained in a (program) buffer for execution. Once an instruction has been executed, the processor turns to the next address in the program buffer where the next instruction is stored, and so on.

The cycle time of the processor in high speed computers is determined by the storage access time and by the controller unit processing time in equal measure.

The generation of pulse interval sequences, particularly for the purposes of testing high-speed storage units and logic circuits, requires the generation of extremely short pulse intervals (in which the test pulses may be placed).

According to the state of the art, there are test systems, as illustrated in FIG. 3, which incorporate sub-storages 81, 82, and 83 in addition to a main processor 80 with a central storage. The main processor 80 is connected both directly and through a sub-storage to an address generator (84), data generator (85) and clock pulse generator (86) which, for their part, are connected to a circuit 87 generating pulse interval sequences.

The sub-storages hold various special instruction sequences. The generator circuit 84, 85 and 86 obtains its information on the one hand directly from the central storage (general data, e.g. program start addresses, start, stop) and on the other hand (special data, e.g. pulse time relation, interval time, ALU Opcodes (ALU=arithmetic and logical unit)) from the appropriate sub-storages. The provision of sub-storages with various different, special instruction sequences gives a significant advantage from the point of view of programming: the various instruction sequences in the sub-storages may easily be combined together.

In this context it should, however, be mentioned that the intermediate circuit of a sub-storage causes a further time overhead.

SUMMARY OF THE INVENTION

The aim of the present invention is to generate pulse interval sequences with periods of cyclically repeating pulse intervals of the shortest possible pulse duration (e.g.<10 nsec).

Said aim of the invention is achieved by means of the following steps. First, data is provided indicating the number and duration of immediately successive identical pulse intervals within a pulse interval sequence. In addition, data is provided indicating the number of repetitions of the pulse interval period within a pulse interval sequence and marking the first and the last pulse interval within the period to be repeated. This data is sequentially cycled under clock control in n stages (n=1, 2, 3, ... to n) of a processor with a data input stationed at the first stage and a data output station at the nth stage. The data reaching the output station by clock control cycling is supplied to a pulse interval generator for generating the pulse interval sequence, with the clock controlled cycle being interrupted in response to a tag in the output station marking the start of a period to be repeated. After this, the data stages are cyclically addressed under processor control from the first to the last pulse interval of the period to be repeated in accordance with the number of repetitions. The data of each addressed stage is supplied to a pulse interval generator. Finally, after completion of the cyclical addressing, the data input at the input station and the cycling of the data continue.

The invention makes it possible effectively to save on the processing time required by the control unit in a processor. The time saving involved is approximately 50%. It results, following an initial phase, from the fact that the measures necessary for processing are executed in a unit separate from the processor simultaneously with the memory accesses in the processor.

BRIEF DESCRIPTION OF THE DRAWINGS

Embodiments of the invention are revealed in the drawings and will be described in more detail below.

FIG. 5A is a diagrammatic representation of the data flow in the postprocessor with data output to the pulse cycle generator for the generation of the first successive identical pulse intervals of duration T1;

FIG. 5B is a diagrammatic representation of the data flow in the postprocessor with data output following on from that illustrated in FIG. 5A to the pulse cycle generator for the generation of further successive identical pulse intervals of duration T2;

FIG. 5C is a representation of the functions of the postprocessor;

FIG. 1 shows, in a diagrammatic representation, a sequence of repeating intervals to be generated: three pulse intervals of duration T1 (3×T1) are followed by five pulse intervals of duration T2 (5×T2) and two pulse intervals of duration T3 (2×T3). Said sequence of pulse intervals 3×T1–5×T2–2×T3 is to be repeated 1024 times (indicated by 1024 x). Let it be assumed that the factor 3 and the value of time duration T1 is stored at address 1, that the factor 5 and the value of time duration T2 is stored at address 2 and that the factor 2 and the value of time duration T3 is stored at address 3 and that the start and end of the cycle of 1024 repetitions is stored at address 1 and 3.

FIG. 2 shows a diagrammatic representation of the computer-controlled generation of a pulse interval sequence as revealed in FIG. 1 using a preprocessor 1, a revolver processor 2, a postprocessor 3 and a pulse cycle generator 4.

The tasks for the pulse interval sequence to be generated are available (stored) in preprocessor 4.

Indirect addressing is not possible in high-speed processors complying with the state of the art for reasons of speed, high-speed processors of this type are, thus, generally programmed in machine language and not in a higher programming language (which would make use of indirect addressing).

The preprocessor in the system embodied in this invention, however, does permit use of a higher programming language with indirect addressing. The disadvantages resulting from this are avoided by other measures, as revealed hereinafter, and are outweighed by further advantages. In addition to control information, the preprocessor supplies the revolver processor with records containing data regarding the number of pulse intervals of the same duration following immediately on from one another (such as 3×T1, 5×T2, 2×T3) and information regarding the cyclical repetition (e.g. 1024 times) of pulse interval sequences, all accomplished, however, without indirect addressing.

The function of the revolver processor 2 is described in detail in conjunction with FIGS. 4A to 4F. As soon as record 1 has passed through the input station after n-clock cycles to the hypothetical nth stage (output station) of the revolver processor in the example given, the further input of data at the input station is suspended until output of 1024 repetitions of the pulse interval period 3×T1, 5×T2, 2×T3 is concluded. Data input and the phased further switching of the information (in the direction of the arrow in FIG. 4) will then be continued. Although data input from preprocessor 1 is stopped at revolver processor 2 during the 1024 repetitions of the pulse interval period, this time may be used by preprocessor 1 for indirect addressing (execution of pointer address instructions) prior to the output of data records to the revolver processor.

In this manner, once the initial phase has been completed, that is the one-time loading of all stages of revolver processor 2, the times necessary for the execution of address instructions no longer have any effect on time requirements in the system as a whole.

Figure 1:
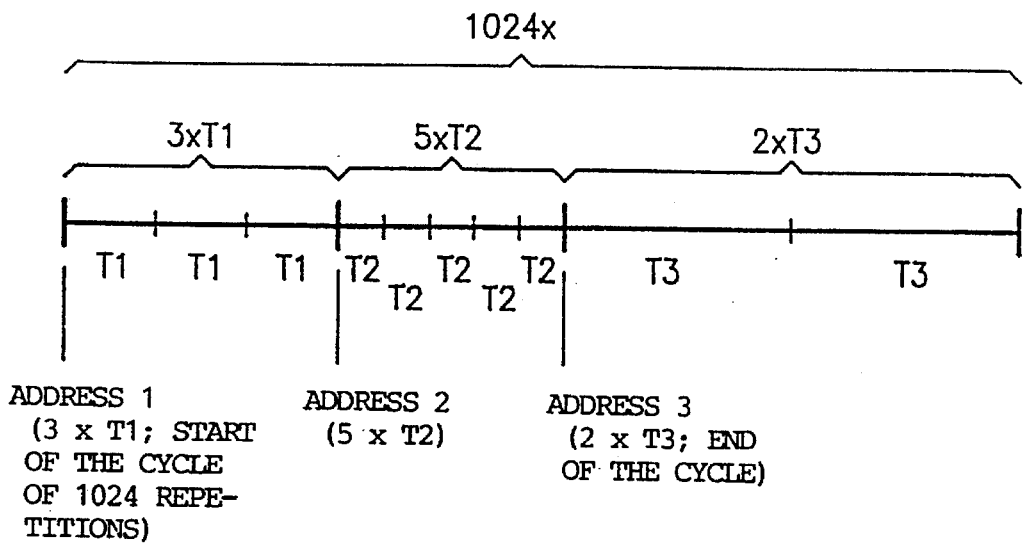
FIG. 1 shows a diagrammatic representation of a sequence of repeating pulse intervals to be generated.
Figure 2:
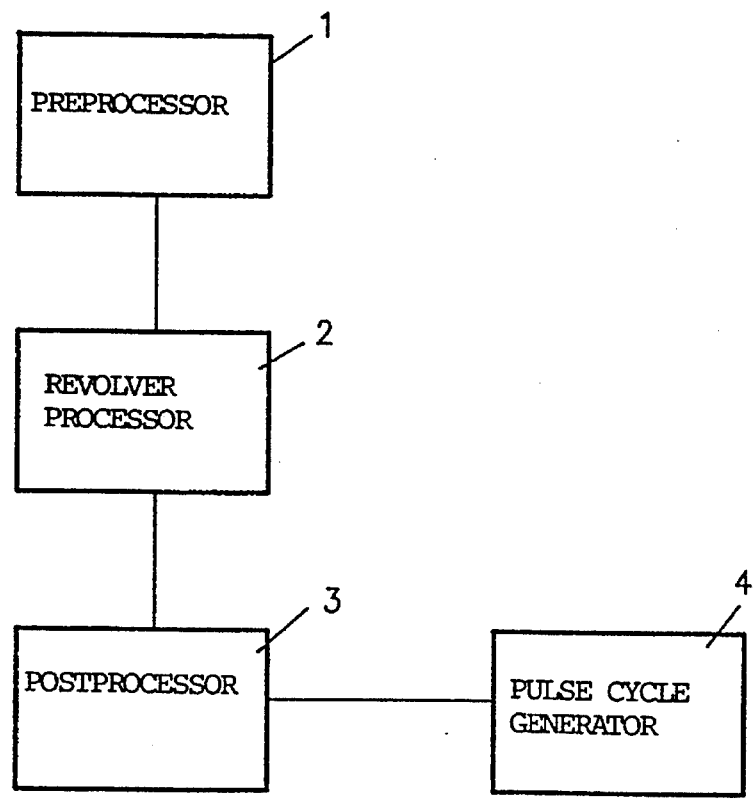
FIG. 2 shows a diagrammatic representation of the computercontrolled generation of a pulse interval sequence as illustrated in FIG. 1, using a preprocessor, a revolver processor, a postprocessor and a pulse cycle generator.
Figure 3:
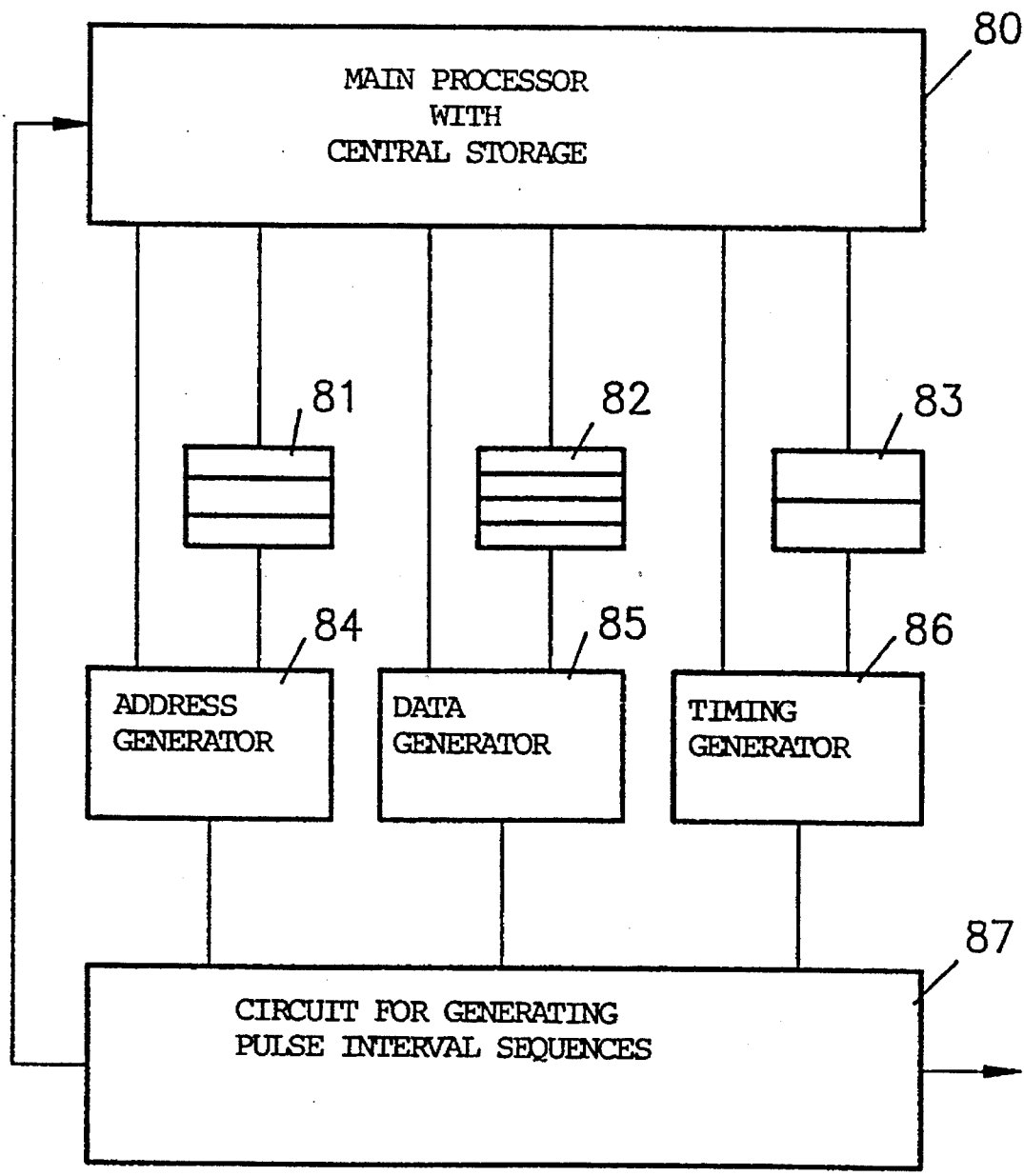
FIG. 3 is a summary view of a system complying with the state of the art showing a main processor and sub-storages.

The preprocessor marked 1 in FIG. 2 has, thus, a special functional task. As already mentioned, its particular purpose is to supply the revolver processor 2 with records in sequence.

Such a simple function could, however, also be undertaken by units less complex than a processor, were it not necessary to satisfy a particular requirement which can only be met by a processor. This results from the requirement in the generation of pulse interval sequences for test purposes, in particular, for addressing through variable indirect addressing 'pointers'. In the absence of such 'pointers', for example, it would only be possible to branch from one record address to another, e.g.

from address A1 (where record 1 is located)

to address A2 (where record 2 is located) and then to address A3 (where record 3 is located), etc.

Frequently, however, it is necessary to make an intermediate branch to a 'pointer' address AX (where an address value variable by the program is located). This address value could have the value for address 10 on the first execution of the branch command, and have a value increased by ten, for instance, that is address 20 in this case, on the second execution.

Figure 4A:
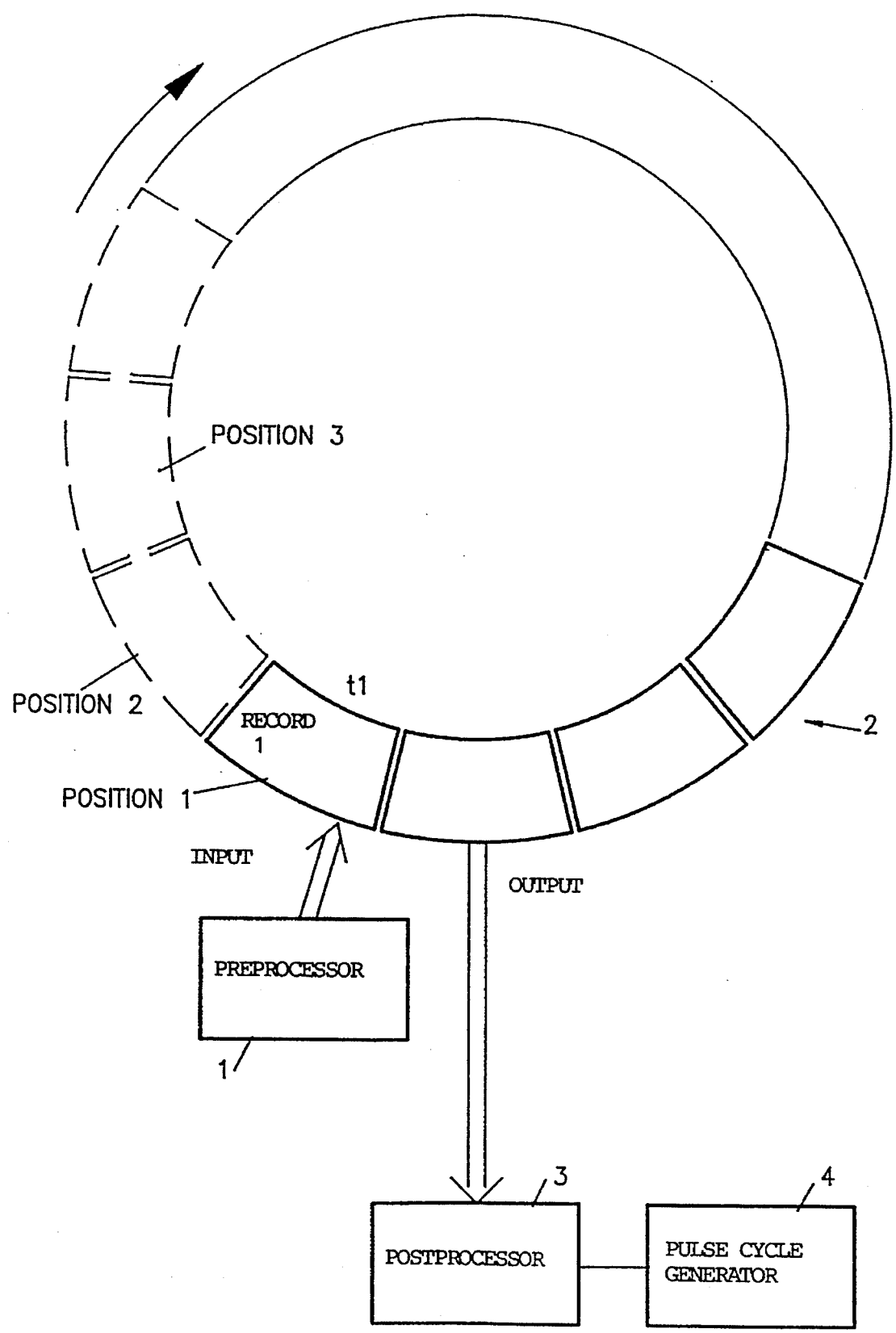
FIG. 4A is a diagrammatic representation of the function sequence in the revolver processor at clock time t1.

FIGS. 4A to 4F show a diagrammatic representation of the functional procedure of the revolver processor; FIG. 4A being at clock time t1. This simplified representation interprets the records (which contain information such as 3×T1, beginning or end of a repetition cycle) as the content of the chambers of a magazine in a 'revolver' processor rotating in the direction shown by the arrow. The preprocessor supplies the records to the input station. The records are output at the station marked output to the postprocessor 3, from where the information is passed further to the pulse cycle generator 4. The revolver processor should have n stages ('revolver magazine chambers') to accommodate the records. At the time of clock cycle t1, the record is input by preprocessor 1 into the revolver processor 2. This record contains, as already mentioned, information from address 1 of the preprocessor: 3×T1 and start of a cycle of 1024 repetitions. With each further clock pulse, the contents of the 'stages of the revolver processor' move one stage further in the direction shown by the arrow and a new record is also input by preprocessor 1 at the input station into revolver processor 2 with each new clock cycle.

Figure 4B:
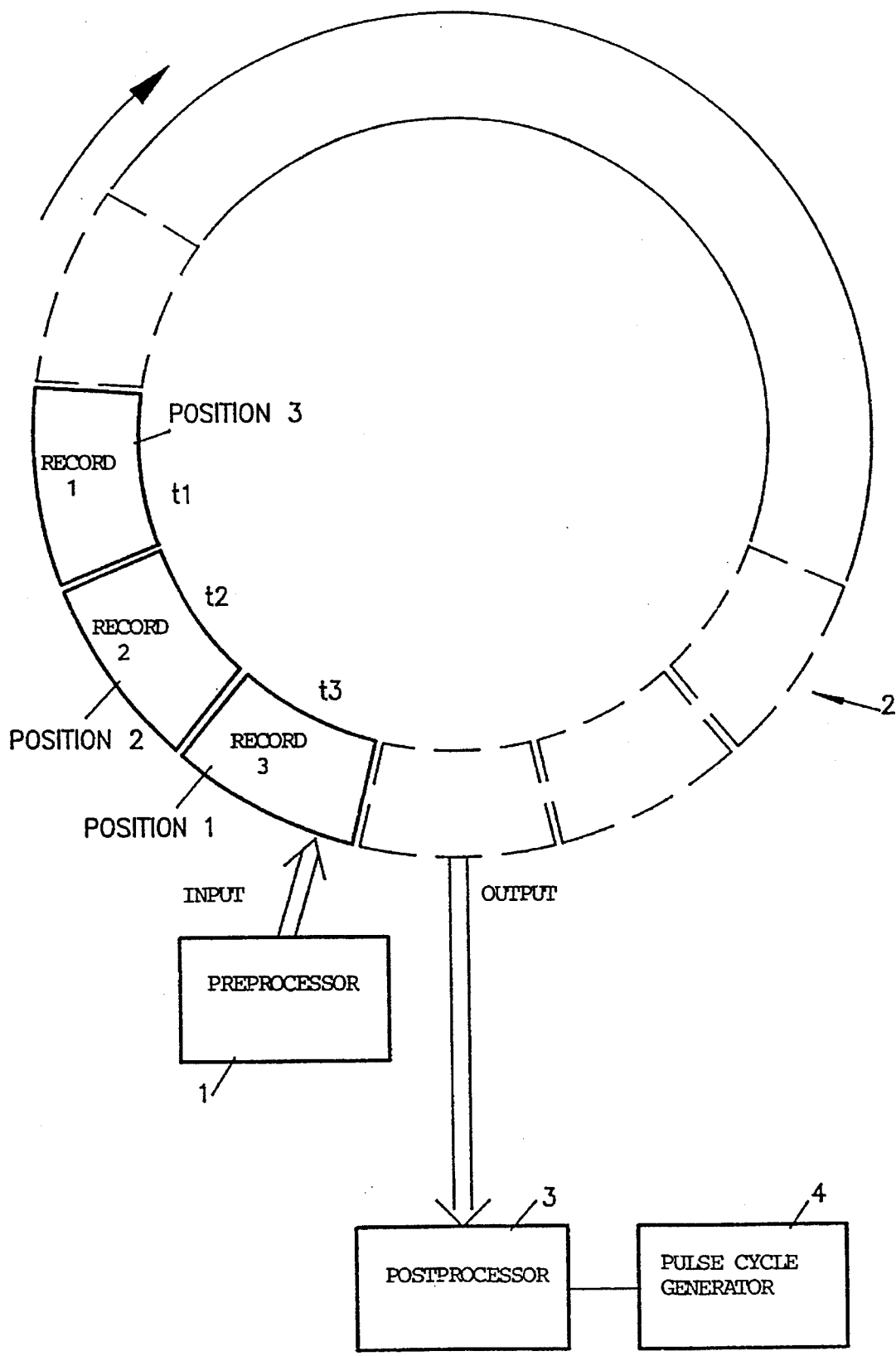
FIG. 4B is a diagrammatic representation of the function sequence in the revolver processor taking into account clock times t1, t2, t3.

FIG. 4B shows the status of the revolver processor at clock cycles t1, t2 and t3. Record 1 has moved on from position 1 in FIG. 4A to position 3 in FIG. 4B. Record 2, which has since been input at clock cycle t2 has moved through the input station (position 1) to position 2, whilst record 3 is input to position 1 at clock cycle t3.

The records sent from the preprocessor to the revolver processor no longer contain any branching or similar operations. The actual task of the preprocessor is to process the original data flow, in which branch operations still occur, so that only records are output to the revolver processor (and corresponding control information such as start tag of a program (sub-)loop via a number of addresses; number of loop cycles; end tag for the program (sub-)loops; additional data ultimately to be processed in the postprocessor, such as cycle time and number of cycles or pointer address for sub-storage in the postprocessor).

Figure 4C:
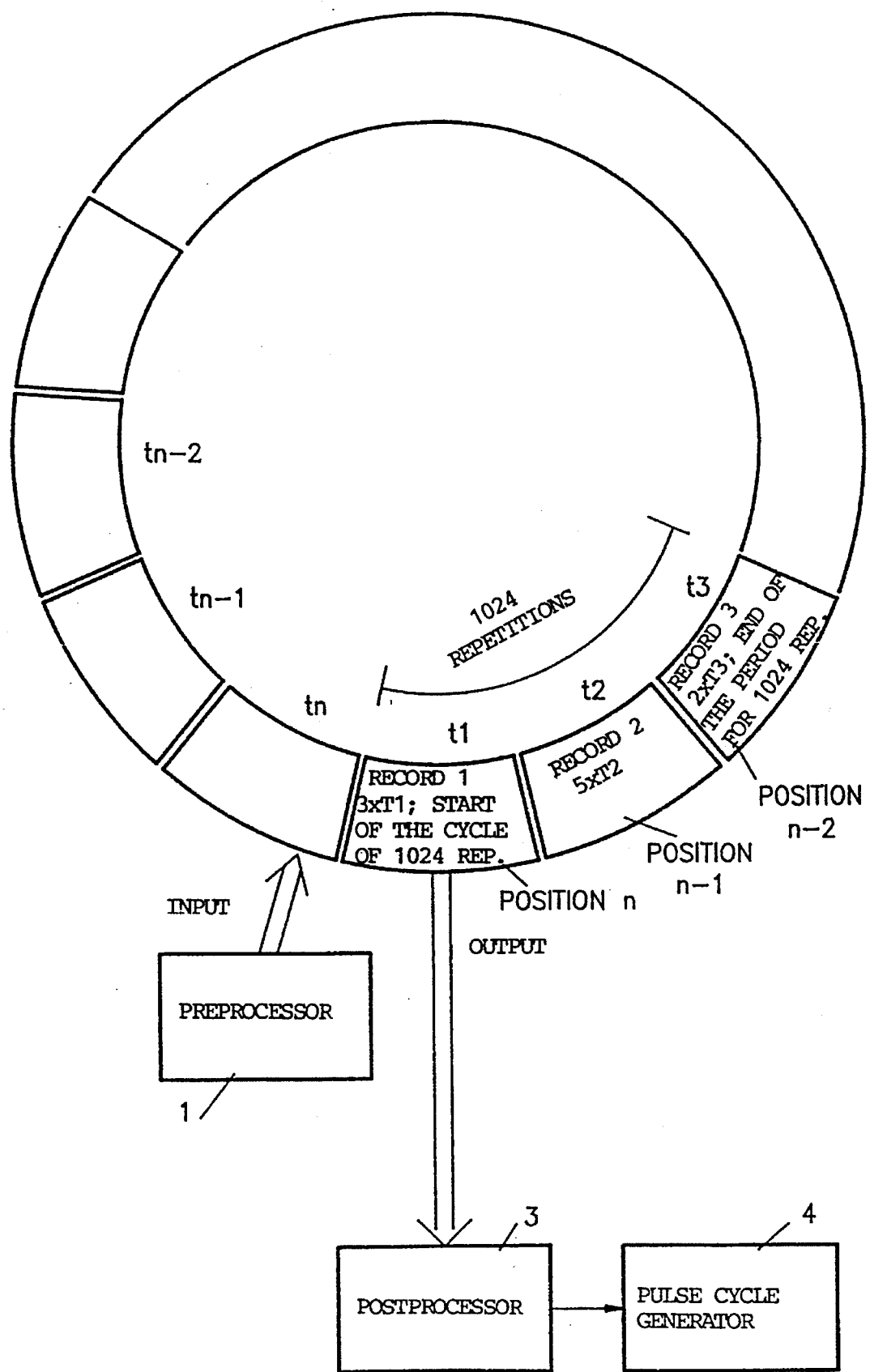
FIG. 4C is a diagrammatic representation of the function sequence in the revolver processor taking into account clock times t1 to tn with the output of data to the postprocessor first completed at the start of a multiple repetition of a sequence embracing three records.
Figure 4D:
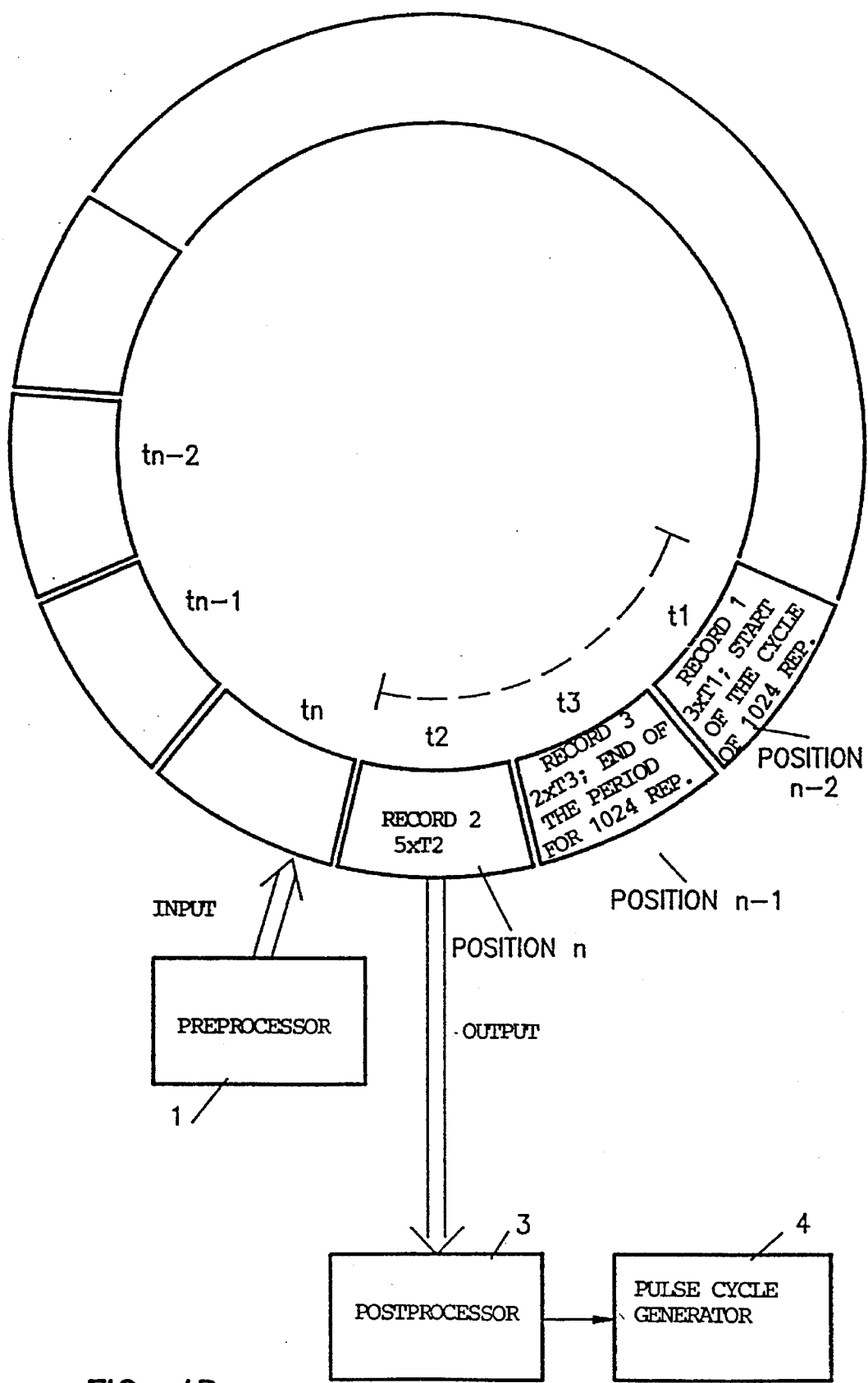
FIG. 4D is a diagrammatic representation of the function sequence in the revolver processor at a clock pulse following the illustration in FIG. 4A.
Figure 4E:
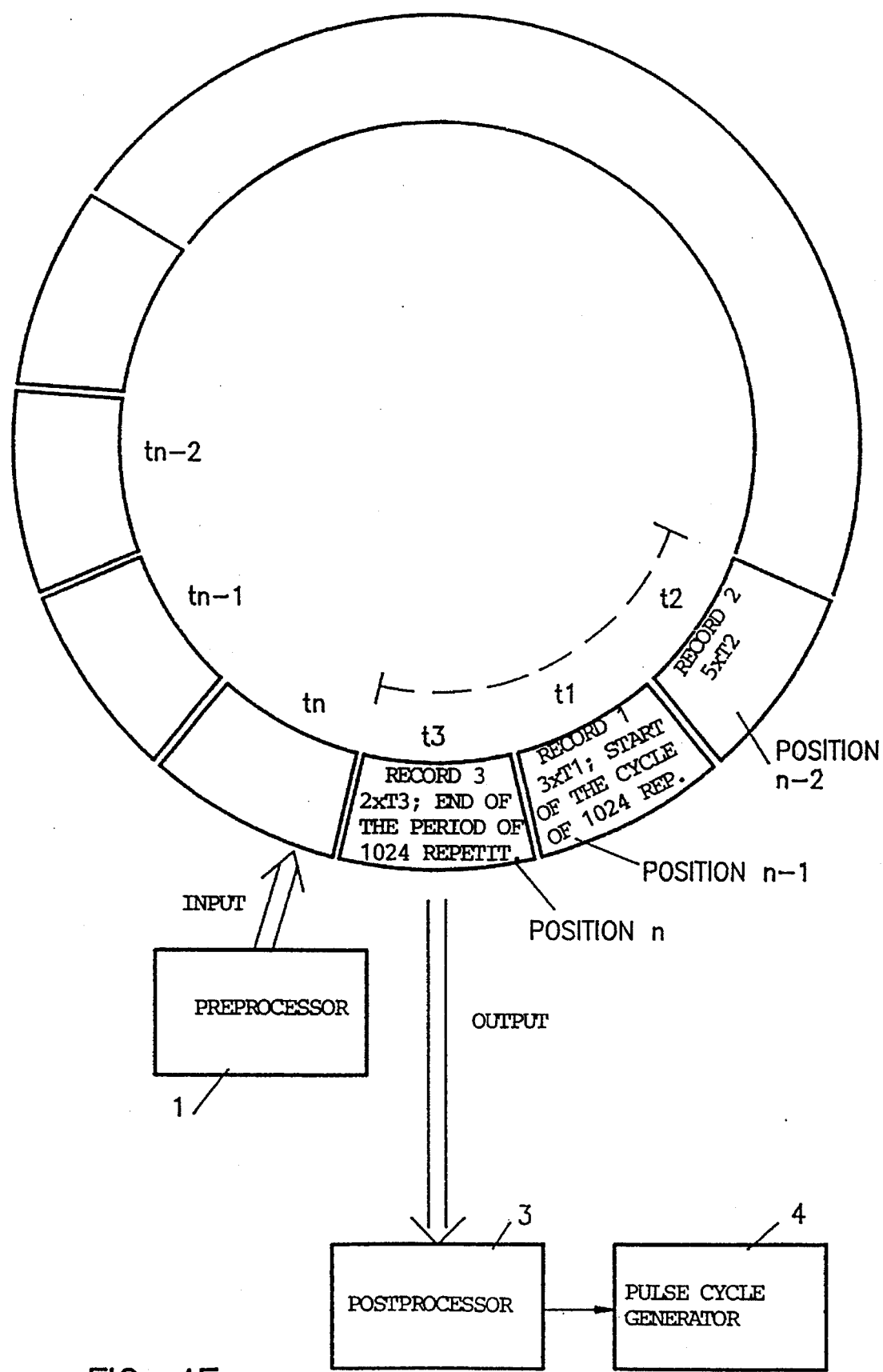
FIG. 4E is a diagrammatic representation of the function sequence in the revolver processor at a clock pulse following the illustration in FIG. 4D.
Figure 4F:
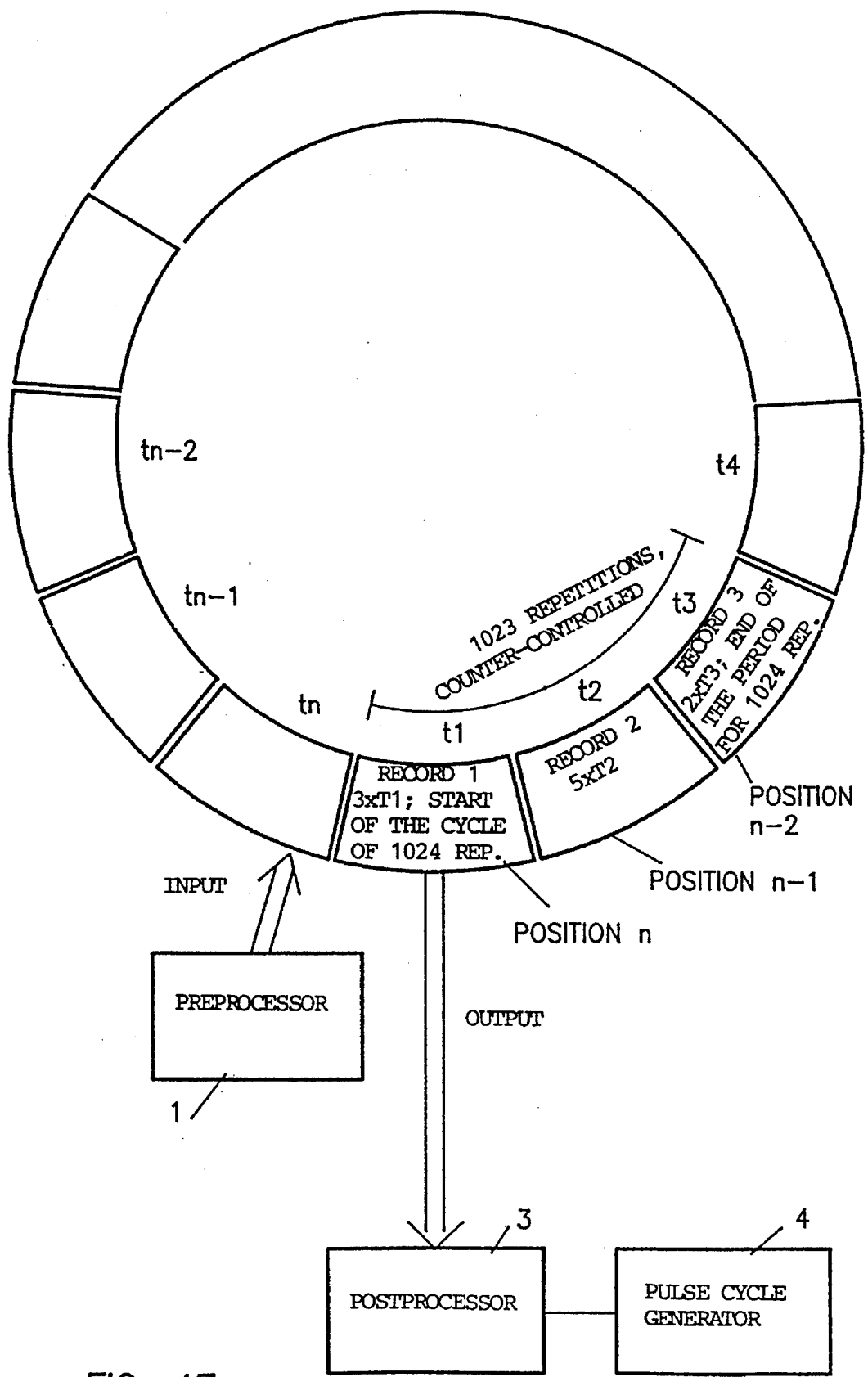
FIG. 4F is a diagrammatic representation of the function sequence in the revolver processor at a clock pulse following the illustration in FIG. 4E.

FIG. 4C shows a diagrammatic representation of the functional procedure of the revolver processor at a later time, at which record 1 has reached the output station. At this time, record 1 is located in position n of the revolver processor, record 2 in position n-1 of the revolver processor, and record 3 in position n-2. The clock cycles at which these records were input at the input station are indicated by t1, t2 and t3. Record 1 in position n includes, amongst other data, the information that the cycle of 1024 repetitions begins here. Record 3 in position n-2 shows that the end of the cycle to be repeated 1024 times is located at this point. This information constitutes a data flow control for records 1, 2 and 3 which takes into account the 1024 repetitions of the cycle 3×T1, 5×T2 and 2×T3. First, as illustrated in FIG. 4C, the information in record 1 will be supplied to the postprocessor. Then (FIG. 4D) record 2 will be transferred from position n-1 to position n and record 3 from position n-2 to position n-1. Record 1 from position n in FIG. 4C is passed into the position released by record 3 at n-2 (FIG. 4D). As now (FIG. 4D), record 2 is located in the output position n, its information is supplied to the postprocessor. Then a further cyclical shift of the records takes place (as shown in FIG. 4E) with the effect that record 3 now moves from position n-1 (FIG. 4D) to position n (FIG. 4E), record 1 from position n-2 (FIG. 4D) to position n-1 (FIG. 4E) and record 2 from position n (FIG. 4F) to position n-2) to position n-2 (FIG. 4D). At the time illustrated in FIG. 4D, record 2 in the output station is transferred into the postprocessor. Then a new cyclical shift occurs (as is clear from FIG. 4E) of records 1, 2, and 3 analogous to the previous shift, so that, as can be seen from FIG. 4F, record 1 once again is located in position n. At this time, the first of the 1024 repetitions of the cycle 3×T1, 5×T2 and 2×T3 is complete, so that only a subsequent 1023 repetitions (controlled by the decrementer) remain to be processed. Data input from the preprocessor into the revolver processor is locked during the repetitions of the cycle in the revolver processor. Data input can only be continued once the 1024 repetitions of the cycle 3×T1, 5×T2 and 2×T3 have been completed. The content of the output station in the revolver processor is transferred to the first stage of the postprocessor, without repetition data, with every "shift" at the output station; in this way the information transferred is serialised and further simplified.

FIGS. 5A and 5B show a diagrammatic representation of the data flow in the postprocessor 3. In the simplified representation, the postprocessor receives the individual data records (e.g. 3×T1, 5×T2 and 2×T3) sequentially from the output station of the revolver processor. This information is then pushed through the individual stages of the postprocessor in a manner specific to the record, as in a shift register. As soon as, as is illustrated in FIG. 5A, the information 3×T1 from record 1, i.e. three consecutive pulse intervals of duration T1, reaches the output of the postprocessor, this information is passed to the pulse cycle generator, in which these pulse cycles are generated under the control of the counter. The preferred embodiment of a pulse cycle generator of this nature is described in German patent application P 28 79 709 by this applicant.

The postprocessor is not, however, only required to fulfil the function of a shift register, it must (and this is what requires a processor) be able to execute branches to specific addresses. In order to assign 3×T1, the pulse interval generator 4 must be supplied with the value for T1, which is stored at a specific address in the postprocessor, three times in succession.

With the next clock cycle of the postprocessor the situation arises as is shown diagrammatically in FIG. 5B. The information originating from record 2 is now found at the output to the postprocessor, i.e. 5×T2. This information is now supplied to the pulse cycle generator 4, in order now to follow the three-fold generation of pulse intervals of duration T1 with a five-fold generation of pulse intervals each of duration T2. This process will then be continued with a double generation of pulse intervals with pulse duration T3, in its turn followed by a three-fold generation of pulse intervals with a duration T1, a five-fold generation of pulse intervals with a pulse duration T2, a double generation of pulse intervals with pulse duration T3, and so on, until the 1024 repetitions of the 3×T1, 5×T2 and 2×T3 cycle have been completed.

FIG. 5C shows a detailed functional illustration of postprocessor 3 in connection with the pulse cycle generator 54.

The records arriving from the revolver processor 2 (in addition to the appropriate control information, they each include the number and duration of pulse intervals, e.g. 3×T1) are clock-driven (c) and shifted in the direction of the arrow through the register stages 31, 32, 33, 34, 35 and 36. These register stages are clocked by the revolver processor clock on line 37. Also exploiting the advantage from the point of view of programming of sub-storage 41 known from the prior art at this point, too, it is possible to connect the intermediate circuit 40 of a sub-storage 41 and a delay element 42 between two register stages. Specific data is passed through sub-storage 41: e.g. cycle time, number of identical consecutive cycles. Other information (preferably control data, e.g. read/write commands, control signals for any subsequent processors connected such as signal generators, timing generators, etc.) are passed direct to the next register level through the delay element 42. The delay is used to compensate for the additional access time caused by sub-storage 41. The time delay between register stages 35 and 36 caused by the intermediate circuit 40 is compensated for by a delay element 38. Register stages 31 to 35, in particular, hold the addresses of the memory locations at which the desired values, e.g. pulse interval duration, are stored. Access to a value of this kind is possible via the memory address held in the register.

The register of postprocessor 3 identified as 50 allows extremely rapid processing in accordance with the invention. It does not hold address data, as do the register stages 31–35 referred to above, but the values that may be called at these addresses, amongst other data, e.g. the value for pulse duration T1. If it is necessary to access this value a number of times during the course of processing, this may now take place directly and not indirectly through memory area addresses. An advantageous time saving is created in this way. The value for T1 is passed from this register 50 (for example, it carries data such as 3×T1 and corresponding control data) via line 51 to the pulse cycle generator 4 and the factor 3 is passed via line 53 to the decrementer 55, the control data being passed via line 52 to the sub-processors not illustrated here (e.g. signal generator, timer generator).

An oscillator 56 provides the clock signal for pulse cycle generator 4 and to revolver processor 2 via lines 64, 65. This clock signal may optionally also be used for the preprocessor through line 66, unless it has its own, independently running oscillator. The output 61 from the AND circuit with the three inputs

59 activate postprocessor

60 counter status 0 on decrementer 55

58 pulse interval generated by cycle generator 4 is used to clock register 50 via line 62 and to synchronize the revolver processor via line 63. All lines 65, 66 and 63 lead to a synchronization circuit for the entire system shown in FIG. 6.

Figure 6:
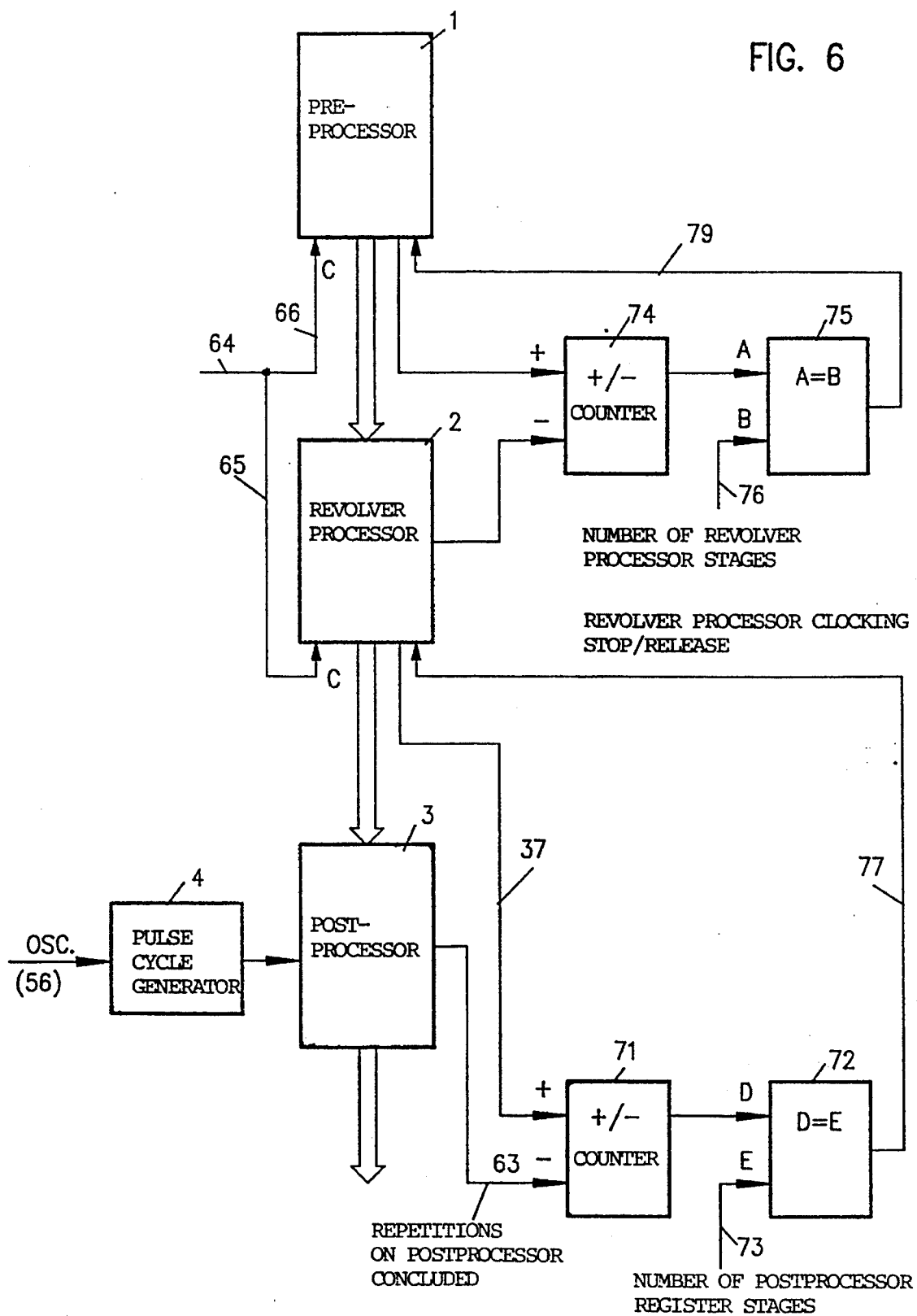
FIG. 6 is a diagrammatic representation of the synchronization of the total system consisting of the preprocessor, revolver processor and postprocessor.

FIG. 6 shows a diagrammatic representation of the synchronization of the complete system, consisting of preprocessor, revolver processor and postprocessor. As in FIG. 2, the preprocessor is identified as 1, the revolver processor as 2 and the postprocessor as 3. The information flows from the processors are indicated diagrammatically as broad arrows. The preprocessor 1 and the revolver processor 2 are clocked via lines 66 and 65 (see FIG. 5). The output clock signals of the revolver processor are sent on line 37 to an incrementer/decrementer 71.

Said clock signals increment said counters, whilst output signals from the postprocessor on line 63 decrement the counters. A signal on line 63 means that repetitions on the postprocessor have been concluded, i.e. that the information 3×T1 has lead to a three-fold repetition of the generation of a pulse interval with the pulse duration T1. The count on counter 71 is applied as value D to a comparator circuit 72 in which said value is compared with value E on line 73, which stands for the number of register stages in the postprocessor. As soon as the comparator circuit 72 determines that there is agreement between D and E, it stops the revolver processor clocking via its output line 77.

In cases where D<E, revolver processor clocking is released again.

The output clock signals of preprocessor 1 are sent to an incrementer/decrementer 74. These clock signals increment the counter, whilst the output clock signals of the revolver decrement this counter 74. The value A of counter 74 is sent to a comparator circuit 75, in which said value is compared with the value B on line 76, the number of revolver processor stages (76). Where the two values are equal, the preprocessor clocking is halted via the output line 79 of the comparator circuit 75. Said clocking is released again in cases where A<B.

It is clear from the above that the processors are synchronized from "bottom to top", i.e. postprocessor 3 determines the time at which revolver processor 2 may supply data to postprocessor 3 and revolver processor 2 determines the time at which preprocessor 1 may supply data to revolver processor 2.

What is claimed is:

1. A method for the computer-controlled generation of pulses wherein immediately succesive identical pulses are repeated to form a pulse interval and immediately succesive pulse intervals are grouped to form a sequence which is then repeated for a selected number of times, comprising the steps of:

providing, from a preprocessor to a revolver processor having n stages, data indicating the number and duration of immediately successive identical pulses within each pulse interval, the number and duration of immediately successive pulse intervals forming a sequence, and the number of times said sequence is to be repeated;

providing the data to the revolver processor through an input at the first of said n stages and sequentially cycling the data under clock control through the revolver processor to an output at the nth stage of said n stages, and;

supplying the data cycled trough the revolver processor and appearing at the output of the revolver processor to a postprocessor for storing said data and transferring said data to a pulse cycle generator for generating the pulses in the number and duration to define each pulse interval; and addressing the postprocessor from the pulse cycle generator with the pulses necessary for each defined pulse interval in the sequence and repeating said addressing for the defined number of repetitions of said sequence.

2. An apparatus for the computer-controlled generation of pulses wherein immediately succesive identical pulses are repeated to form a pulse interval and immediately succesive pulse intervals are grouped to form a sequence which is then repeated for a selected number of times, comprising;

a preprocessor;

a revolver processor having n stages and an input at the first stage and an output at the nth stage;

a post processor; and a pulse generator;

the preprocessor being coupled to the input at the first stage of the revolver processor and supplying data to the revolver processor to indicate the number and duration of successive pulses forming each pulse interval, the number and duration of successive pulse intervals forming a sequence, and the number of times the sequence is to be repeated;

the revolver processor processing the data and marking the first and last pulse within the sequence to be repeated by sequentially circulating the predetermined data under clock control and transferring said data via said output to the postprocessor;

the postprocessor processing the data, from the revolver processor, and supplying it to the pulse generator, the postprocessor having a register for direct addressing of the data;

the pulse generator generating pulses in response to the clock-controlled cycled data; and means for interrupting the clock control in response to a tag provided to the data at the output station of the revolver processor marking the start of a period to be repeated, and for subsequently cyclically addressing the data stages under processor control from the first to the last pulse interval at the period to be repeated according to the number of repetitions.

3. A computer-controlled generator of pulses wherein immediately succesive identical pulses are repeated to form a pulse interval and immediately succesive pulse intervals are grouped to form a sequence which is then repeated for a selected number of times, comprising:

a preprocessor for sequentially supplying data, indicating the pulses in a pulse interval including the number and duration of immediately successive pulse intervals in a sequence, and the number of repetitions of the sequence, coupled to a revolver processor;

the revolver processor sequentially cycling the data from the preprocessor under control of a clock in n stages;

said revolver processor having a data input station and a data output station;

a postprocessor, providing the clock-controlled cycled data to the output station and generating, from the information supplied by said revolver processor and in response to a tag in the data marking the start of a sequence to be repeated, the pulse sequences for controlling the pulse cycle generator, being further coupled to means for interrupting the clock;

means for cyclically addressing the data from the first to the last pulse interval forming the sequence and supplying the pulse generator, from the output station, said data; and means for indicating the completion of the data and activating said preprocessor to input new data at the input station of the revolver processor and cycling the new data.

4. A computer-controlled generator system for generating at a system output a series of pulses wherein immediately succesive identical pulses are repeated to form a pulse interval and immediately succesive pulse intervals are grouped to form a sequence which is then repeated for a selected number of times, comprising:

- a computer-controlled generator system having a system output;
- a clock having an output coupled to a preprocessor and a revolver processor;
- said preprocessor sequentially supplying data establishing a selected series of pulses including the number and duration of the pulses forming each pulse interval, the number and duration of immediately successive identical pulse intervals forming a sequence, the number of repetitions of the sequence, and marking of the first and the last pulse interval within the established sequence;
- means coupled to said preprocessor for interrupting the clock output coupled to the preprocessor, said means including a first counter coupled to a first comparator;
- said preprocessor further providing a clocked output signal to said first counter having a pair of inputs and an output;
- said revolver processor, having a plurality of stages, including a first stage and a final stage, a data input station, at said first stage, coupled to said preprocessor for receiving said data from said preprocessor and sequentially cycling said data, under clock control, through said plurality of stages to a data output station at the final stage of said plurality of stages;
- said preprocessor being coupled to said revolver processor through said data input station of said revolver processor;
- means coupled to said revolver processor for interrupting the data from the preprocessor, said means including a second counter and a second comparator; and
- said revolver processor further providing a output clocked signal to a second counter having a pair of inputs and an output;
- a postprocessor coupled to said data output station of said revolver processor for generating at an output of the system said series of sequences;
- said post processor generating said series of sequences from the data and in response to a tag in the output station marking the start of a sequence to be repeated, controlling a pulse cycle generator to generate the pulses for each said sequence, and providing said second counter with a count of said number of completed sequences in said series of sequences;
- said first comparator receiving, at its first input, the output of said first counter and comparing the output of said first counter to a predetermined number equal to the number of stages in said revolver processor and, upon achieving a match providing an output to said preprocessor to stop the preprocessor;
- said second comparator receiving, at its first input, the output of said second counter and comparing the output of said second counter to a predetermined number equal to the number of register stages in said post processor and, upon achieving a match providing an output to said revolving processor to stop the revolver processor;
- means for interrupting the clock-controlled cycle coupled to the postprocessor;
- means for cyclically addressing the data stages from the first to the last pulse interval of the sequence and supplying the pulse generator, from the output station, the data of each addressed stage, and repeating the sequence for a selected number of repetitions; and
- means for indicating the completion of the selected number of repetitions of said sequence and activating said preprocessor to input new data at the input station of the revolver processor and cycling the new data.

* * * * *